United States Patent
Lin et al.

(10) Patent No.: US 9,755,620 B1
(45) Date of Patent: Sep. 5, 2017

(54) DEVICE FOR DETECTING AND CORRECTING TIMING ERROR AND METHOD FOR DESIGNING TYPICAL-CASE TIMING USING THE SAME

(71) Applicant: National Chung Cheng University, Chia-Yi (TW)

(72) Inventors: Tay-Jyi Lin, Chia-Yi (TW);
Jinn-Shyan Wang, Chia-yi (TW);
Hong-Chih Lin, New Taipei (TW);
Ting-Yu Shyu, New Taipei (TW)

(73) Assignee: NATIONAL CHUNG CHENG UNIVERSITY, Chia-Yi (TW)

( * ) Notice: Subject to any disclaimer, the term of this patent is extended or adjusted under 35 U.S.C. 154(b) by 0 days.

(21) Appl. No.: 15/212,698

(22) Filed: Jul. 18, 2016

(30) Foreign Application Priority Data

May 9, 2016 (TW) ............................... 105114296 A

(51) Int. Cl.
*H03K 3/037* (2006.01)
(52) U.S. Cl.
CPC ................... *H03K 3/0375* (2013.01)
(58) Field of Classification Search
CPC ............................ H03K 3/0375; G06F 9/3861
USPC ........................................................ 327/225
See application file for complete search history.

(56) References Cited

U.S. PATENT DOCUMENTS

| 6,442,678 | B1* | 8/2002 | Arora | G06F 9/30072 |
| | | | | 712/218 |
| 7,213,132 | B2* | 5/2007 | Benjamin | G06F 9/3867 |
| | | | | 712/219 |
| 2015/0277927 | A1* | 10/2015 | Lin | G06F 9/3861 |
| | | | | 712/219 |
| 2016/0173274 | A1* | 6/2016 | Choi | H03M 9/00 |
| | | | | 375/362 |

* cited by examiner

*Primary Examiner* — Lincoln Donovan
*Assistant Examiner* — Metasebia Retebo
(74) *Attorney, Agent, or Firm* — Muncy, Geissler, Olds & Lowe, P.C.

(57) ABSTRACT

A device for detecting and correcting timing error and a method for designing typical-case timing using the same is disclosed. The device includes two datapath units connected with first and second multiplexers and two transition detectors. Each datapath unit receives and calculates an input signal to generate a speculation value and a correct value. Then, the speculation value and the correct value are transmitted to the first and second multiplexers and the transition detectors determine whether transition of the outputted speculation value is unstable. If yes, the datapath unit outputting the speculation value is stalled for a period of time for correction, whereby the second multiplexer outputs the correct value. If no, the datapath unit outputs the speculation value, then the present invention uses the undertaken timing as a setting specification to complete a circuit design. The present invention can improve system efficiency and power of the whole circuit.

11 Claims, 7 Drawing Sheets

DEVICE FOR DETECTING AND CORRECTING TIMING ERROR AND METHOD FOR DESIGNING TYPICAL-CASE TIMING USING THE SAME

This application claims priority for Taiwan patent application no. 105114296 filed on May 9, 2016, the content of which is incorporated by reference in its entirely.

BACKGROUND OF THE INVENTION

Field of the Invention

The present invention relates to a processing device for detecting timing error and value signals and a method for designing typical-case timing using the same, particularly to a device for detecting and correcting timing error and a method for designing typical-case timing using the same.

Description of the Related Art

After integrated circuits arrive, the integrated circuits suddenly become ubiquitous, such as computers, smart phones, smart watches, intelligence household appliances, or digital appliances. The mature technology can greatly change human life. The integrated circuits are divided into digital integrated circuits, analog integrated circuits and mixed-signal integrated circuits.

The digital circuits are affected by variation parameters such as parameter drift of fabrication processes, voltage stability, operation temperature, calculation data, aging or clock jitter. The conventional technology only considers data variation and average efficiency for optimizing typical-case distribution. As a result, the conventional technology began to utilize error detectors. For example, refer to FIG. 1. An error detection circuit 10 of Razor-1 samples data twice. An upper output register 12 has a main clock to obtain a speculation value, and a lower shadow register 14 has a skewed clock to obtain a correct value. Then, the speculation value and the correct value are transmitted to a comparator 16 to determine whether speculation is correct. If the speculation is wrong, a stop signal is sent out to add a cycle for correction. Besides, the error detection circuit 10 of Razor-1 has a problem with short path. Since the shadow register 14 of Razor-1 requires a skew clock to obtain the correct value, it costs shorter time to calculate data paths, which results in the problem with short path. Thus, a buffer is added to overcome the problem. However, the buffer leads to a larger area and high power dissipation. Razor-1 obtains the speculation value at a positive level of one cycle, and obtains the correct value and detects error at a negative level of the identical cycle. The added buffer time equals to a duty cycle of the positive level, which represents error toleration capability of Razor-1.

In addition, the inventor of the present invention disclosed a speculative lookahead (SL) error detection circuit 20 to improve the drawbacks of Razor-1, wherein all the registers use synchronization clocks. Since the registers do not require skew clocks, the registers do not have the problem with short path. The solution is to use two datapath units. A first datapath unit 22 and a second datapath unit 24 controlled by the system calculate alternately. For example, the first datapath unit 22 calculates at the first cycle and obtains a speculation value at the second cycle; and the second datapath unit 24 calculates input values at the second cycle; and at the third cycle, the first datapath unit 22 calculates for two cycles to obtain a correct value. Finally, a comparator 26 compares the correct value with the speculation value to determine whether speculation is correct. If the speculation is wrong, the comparator 26 outputs a stop signal to the system. The system adds a cycle to correct error. The error detection circuit 20 can improve the drawbacks of Razor-1. The error detection circuit 20 is different from Razor-1 using cycles of non-synchronization clocks. The speculative lookahead error detection circuit 20 needs to obtain only specification time of function units to consider the error toleration capability. Since the first datapath unit 22 and the second datapath unit 24 obtain the speculation value at the first cycle, obtain the correct value at the second cycle and compare them to detect error, whereby the error detection circuit 20 has to wait for the correct value to determine whether the speculation value is correct, the efficiency may be limited.

To overcome the abovementioned problems, the present invention provides a device for detecting and correcting timing error and a method for designing typical-case timing using the same, which use transition detectors to determine whether transition of a speculation value occurs, thereby improving efficiency of the whole system.

SUMMARY OF THE INVENTION

A primary objective of the present invention is to provide a device for detecting and correcting timing error and a method for designing typical-case timing using the same, which detects transition of data and error when a datapath unit obtains a speculation value, and which adds a delay of one cycle to correct error when transition of data occurs and the data is unclear, and which immediately detects error without waiting to compare with a correct value, so as to save time of comparing the speculation value with the correct value.

Another objective of the present invention is to provide a device for detecting and correcting timing error and a method for designing typical-case timing using the same, wherein the device for detecting and correcting timing error is used to shorten delay time generated by calculation, and uses the delay time to define a specification to complete a circuit design, thereby meeting a circuit design for typical-case timing and improving efficiency and power of the whole system.

To achieve the abovementioned objectives, the present invention provides a device for detecting and correcting timing error, which comprises two datapath units, a first multiplexer, a second multiplexer, two transition detectors and a control logic gate. Each datapath unit has an input terminal and an output terminal, and each datapath unit uses the input terminal to receive an input signal, calculates the input signal and uses the output terminal to generate and output at least one speculation value and a correct value. The first multiplexer is connected with the output terminal of each datapath unit to receive and output the speculation value outputted by each datapath unit. The second multiplexer is connected with the output terminal of each datapath unit to receive and output the correct value outputted by each datapath unit. The transition detectors are respectively connected with the output terminals of the datapath units, and a second input terminal of each transition detector connects with the output terminal of each datapath unit. When one of the datapath units outputs the speculation value, its corresponding the transition detector determines whether transition at the output terminal of the datapath unit corresponded thereof is stable, and when the transition is unstable, the transition detector outputs a wait signal, and when the transition is stable, the transition detector directly outputs the speculation value. The control logic gate is connected with the transition detectors to receive the wait signal outputted by one of the transition detectors, outputs it, and stalls the datapath unit outputting the speculation value for a period of time, whereby the second multiplexer outputs the correct value and the first multiplexer corrects the speculation value and then outputs it.

The output terminals of the datapath units further receive a clock signal being 0 or 1, and the speculation value and the correct value are 0 or 1.

Each transition detector further comprises two registers and an OR gate. Each register has a data input terminal and a clock signal terminal, and the data input terminals of the registers are connected with the input terminal of the datapath unit to receive the clock signal, and the clock signal terminals of the registers are connected with the output terminal of the datapath unit to receive the speculation value. The OR gate is connected with the registers, and when the clock signal received by one of the registers is 1 and the speculation value received by the register changes from 1 into 0 or changes from 0 into 1, the register outputs the clock signal and uses the OR gate to output the wait signal.

The device for detecting and correcting timing error further comprises a time controller connected with the transition detectors, the control logic gate, the first multiplexer and the second multiplexer, transmitting an output thereof and the clock signal to the datapath units, and controlling timing of using the first multiplexer and the second multiplexer to respectively receive the correct value and the speculation value. Two demultiplexers are connected between the time controller and the datapath units, and an input terminal of the demultiplexer connects with the time controller and receives the clock signal, and an output terminal of the demultiplexer transmits the clock signal to the datapath units.

To achieve the abovementioned objectives, the present invention provides a method for designing typical-case timing applied to the device for detecting and correcting timing error, and the method comprises: timing undertaken by the device for detecting and correcting timing error is defined as an initial specification. The process defines that a worst case of the device for detecting and correcting timing error is double the timing based on the timing. The initial specification set by the timing and the worst case are used as a setting specification and a circuit design is completed based on the setting specification.

Finally, the process determines whether the circuit design meets the setting specification. If the answer is yes, the process is ended. If the answer is no, the initial specification of the timing is relaxed, and the worst case is adjusted again to complete the setting specification and the process proceeds to subsequent circuit designs.

Below, the embodiments are described in detail in cooperation with the drawings to make easily understood the technical contents, characteristics and accomplishments of the present invention.

DETAILED DESCRIPTION OF THE INVENTION

Digital circuits use the worst case to design parameters to save hardware resources and power dissipation consumed by conservative over designs, uses a dynamic timing violation detection mechanism to monitor operation variation deviating from a typical case and immediately compensates. The present invention discloses a design used to the typical case. Compared with the design of the conventional technology, the present invention improves 42% efficiency in a 28 nm experiment, or saves 41% hardware resources and 54% power dissipation taking consideration of identical efficiency.

Figure 1:
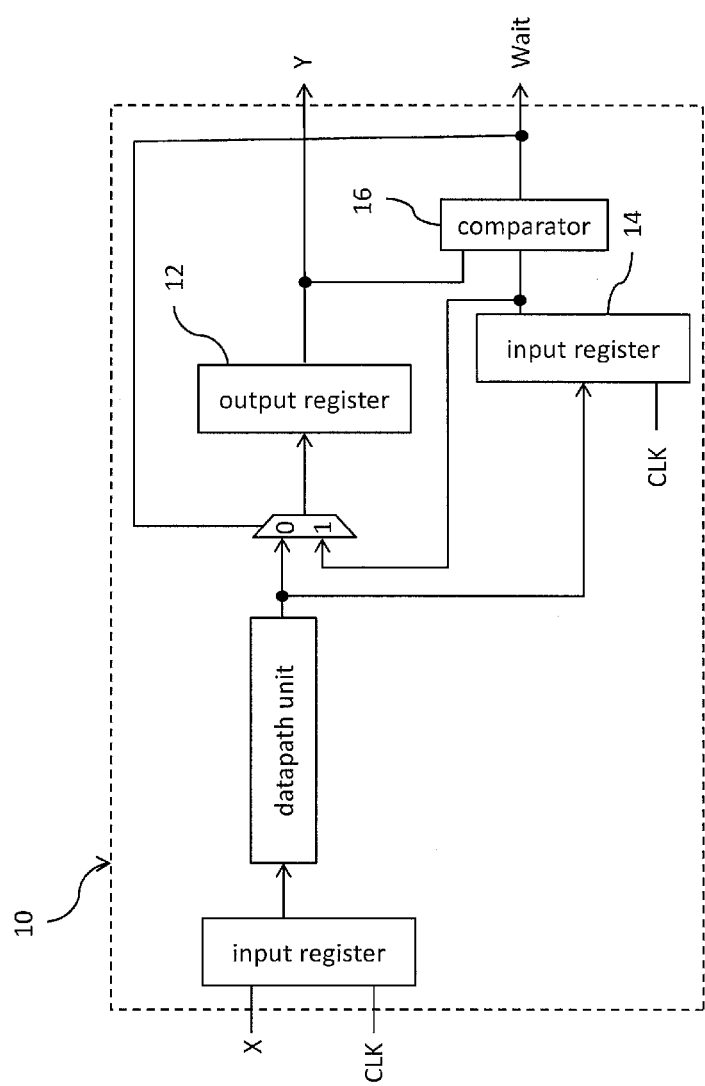
FIG. 1 is a diagram schematically showing an error detection circuit in a conventional technology.
Figure 2:
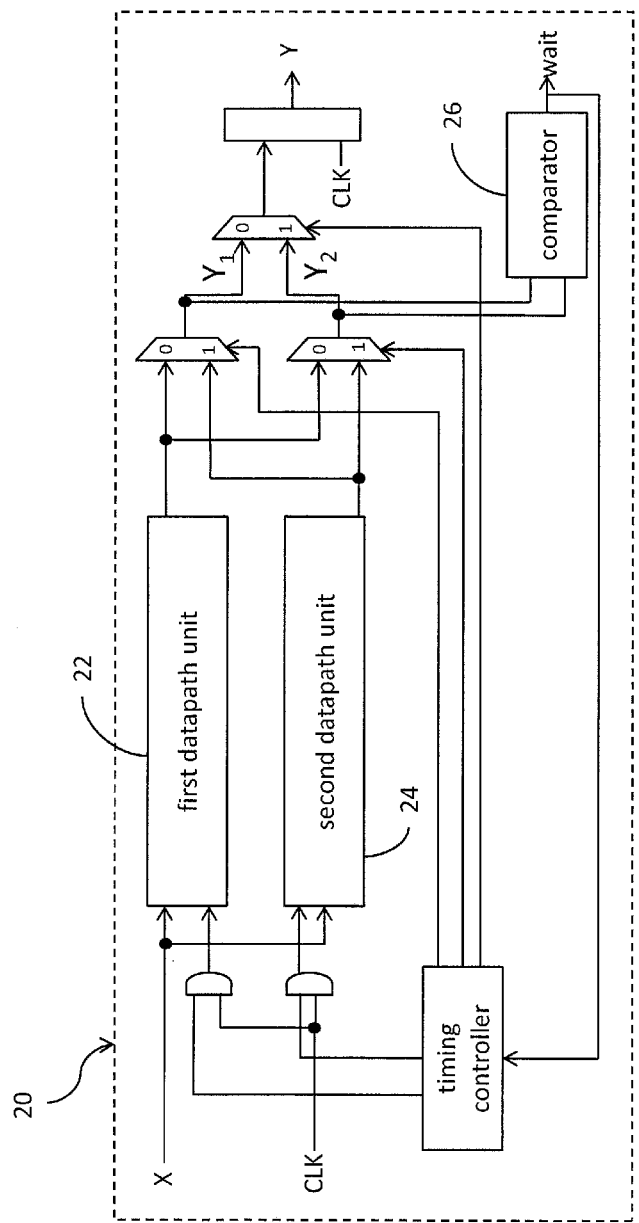
FIG. 2 is a diagram schematically showing a speculative lookahead error detection circuit in a conventional technology.
Figure 3:
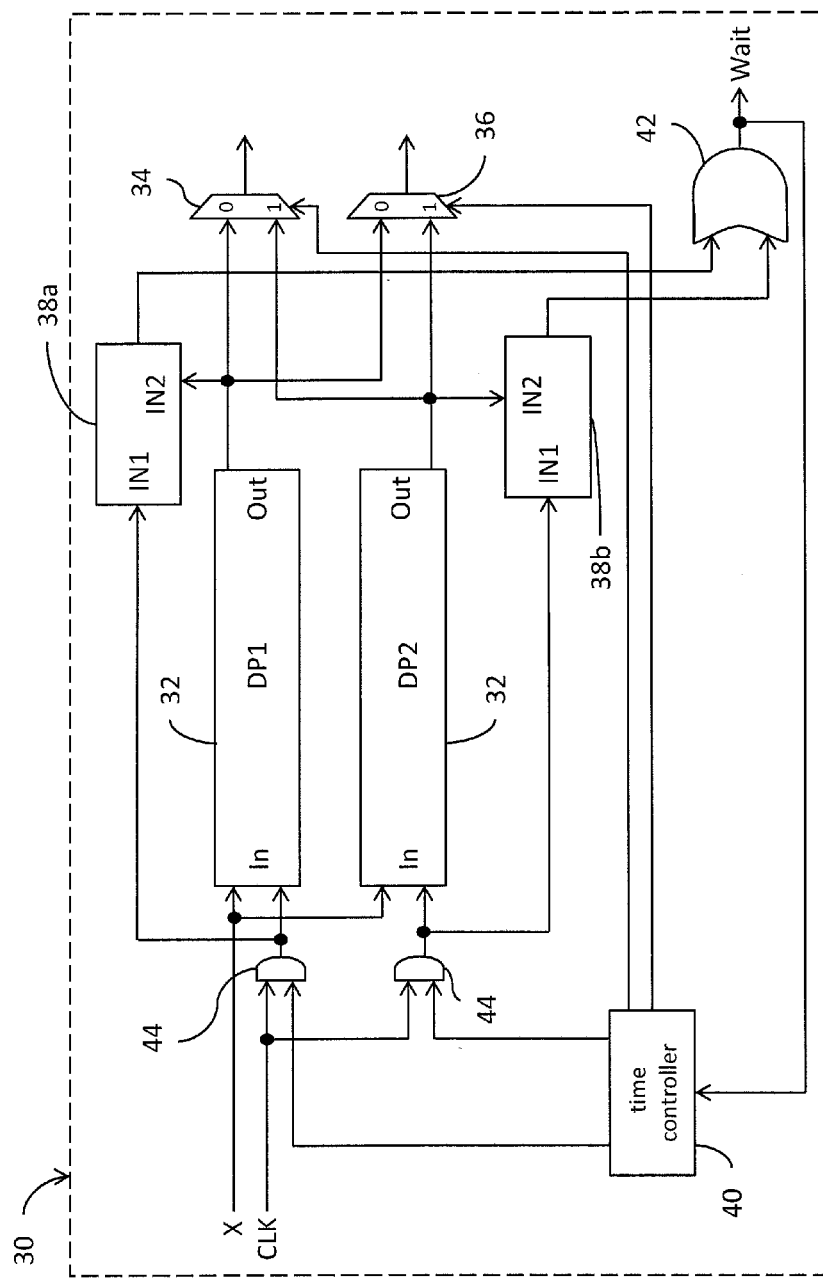
FIG. 3 is a diagram schematically showing a device for detecting and correcting timing error according to one embodiment of the present invention.

Firstly, refer to FIG. 3 of the present invention. A device for detecting and correcting timing error 30 comprises two datapath units DP1, DP2 32, a first multiplexer 34, a second multiplexer 36, two transition detectors 38a, 38b, a time controller 40 and a control logic gate 42. In the embodiment, the control logic gate 42 is an OR gate. Each of the datapath units DP1, DP2 32 has an input terminal In and an output terminal Out. The input terminal In receives an input signal X and a clock signal CLK. The first multiplexer 34 is connected with the output terminal Out of each datapath unit 32. The second multiplexer 36 is connected with the output terminal Out of each datapath unit 32. The transition detectors 38a and 38b are respectively connected with the output terminals Out of the datapath units 32. For example, the transition detector 38a is connected with the output terminal Out of the datapath unit DP1 32, and the transition detector 38b is connected with the output terminal Out of the datapath unit DP2 32. In the embodiment, each of the transition detectors 38a, 38b has a first input terminal IN1 and a second input terminal IN2. The first input terminal IN1 and the second input terminal IN2 of each of the transition detectors 38a and 38b are respectively connected with the input terminal In and the output terminal Out of the datapath unit 32. The first input terminal IN1 of each of the transition detectors 38a and 38b receives the clock signal CLK. The first input terminal IN1 and the second input terminal IN2 of the transition detector 38a are respectively connected with the input terminal In and the output terminal Out of the datapath unit DP1 32. The first input terminal IN1 and the second input terminal IN2 of the transition detector 38b are respectively connected with the input terminal In and the output terminal Out of the datapath unit DP2 32. The time controller 40 is connected with the transition detectors 38a, 38b, the control logic gate 42, the first multiplexer 34 and the second multiplexer 36. Two demultiplexers 44 are connected between the time controller 40 and the datapath units DP1, DP2 32.

Figure 4:
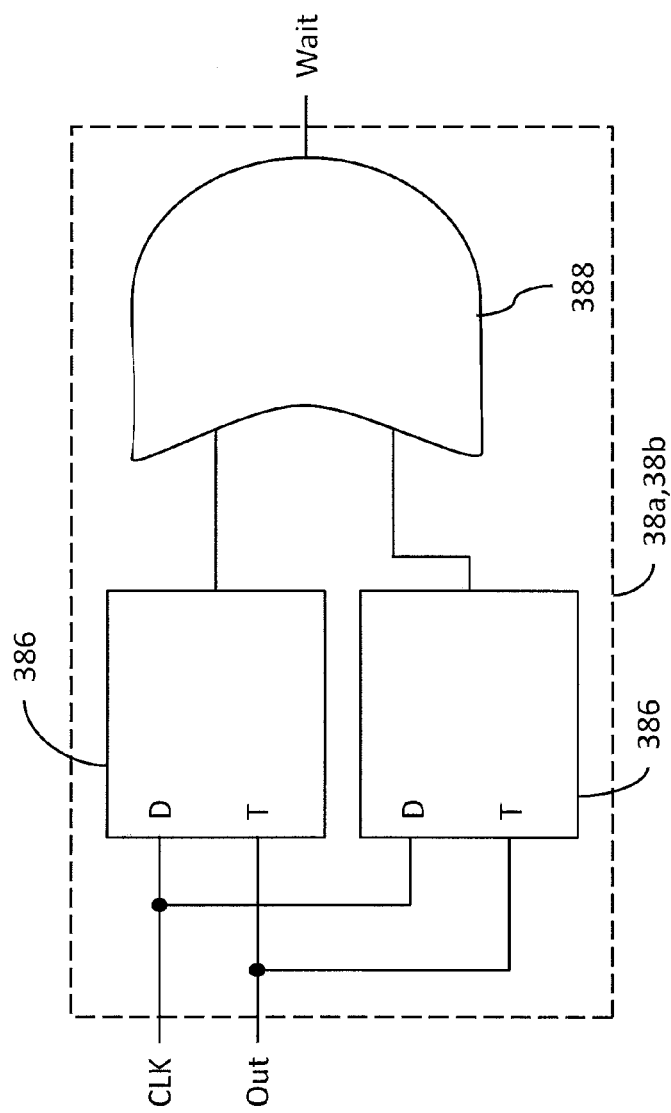
FIG. 4 is a diagram schematically showing a transition detector of FIG. 3.

Then, refer to FIG. 3 and FIG. 4 of the present invention to describe connection relationship of the transition detectors 38a and 38b in detail. Each of the transition detectors 38a and 38b further comprises two registers 386 and an OR gate 388. Each of the transition detectors 38a and 38b has a data input terminal D and a clock signal terminal T. The data input terminals D of the registers 386 are electrically connected with the input terminal In of the datapath unit 32 to receive the clock signal CLK, and the clock signal terminals T of the registers 386 are electrically connected with the output terminal Out of the datapath unit 32 to receive the speculation value. The OR gate 388 is connected with the registers 386.

After explaining the connection relationship of the present invention, the present invention describes the processing method of the device for detecting and correcting timing error in detail. Refer to FIG. 3 and FIG. 4. Firstly, the input terminals In of the datapath units DP1, DP2 32 receive an input signal X, and the datapath units DP1, DP2 32 receive the input signal X in a round-robin way and calculate the input signal X. Then, the output terminals Out of the datapath units DP1, DP2 32 respectively output the speculation value and a correct value. For example, the datapath unit DP1 32 generates the speculation value, and then the datapath unit DP2 32 generates the correct value. Afterwards, the datapath unit DP1 32 transmits the speculation value to the first multiplexer 34, whereby the first multiplexer 34 outputs the speculation value received. The datapath unit DP2 32 transmits the correct value to the second multiplexer 36, whereby the second multiplexer 36 outputs the correct value. When the output terminal Out of the datapath unit DP1 32 generates the speculation value, the transition detector 38a connected with the output terminal Out of the datapath unit DP1 32 determines whether transition of the speculation value occurs. The clock signal CLK is 0 or 1, and the speculation value and the correct value are 0 or 1. The register 386 of the transition detector 38a receives the speculation value of the datapath unit DP1 32. For example, when the clock signal CLK received by one of the registers 386 is 1 and the speculation value received by the register 386 changes from 1 into 0 or changes from 0 into 1, the register 386 outputs the clock signal CLK being 1 and transmits the clock signal CLK to the OR gate 388 to output await signal Wait. The transition detector 38a determines that transition at the output terminal Out of the datapath unit DP1 32 occurs in the abovementioned way. The time controller 40 transmits an output thereof and the clock signal CLK to two demultiplexers 44 to control the datapath units DP1, DP2 32 to receive the input signal X in a round-robin way, and uses the clock signal CLK to control timing of using the first multiplexer 34 and the second multiplexer 36 to respectively receive the correct value and the speculation value. The transition detector 38a or the transition detector 38b outputs the wait signal Wait, which represents the speculation value unstably received may be wrong. When detecting error, the transition detector 38a or the transition detector 38b transmits the wait signal Wait to the control logic gate 42 whereby the control logic gate 42 transmits the wait signal Wait to the system provided with the device for detecting and correcting timing error 30. Meanwhile, the time controller 40 is used to receive the wait signal Wait to stall the datapath unit DP1 32 outputting speculation value for a period of time. In the embodiment, the period of time that the datapath unit DP1 32 stalls is one cycle. The present invention adds one cycle to correct error. The time controller 40 controls time of outputting the correct value of the second multiplexer 36 and outputs the correct value through the second multiplexer 36. If the transition does not occur, the time controller 40 controls time of outputting the speculation value of the first multiplexer 34 and outputs the correct value through the first multiplexer 34. The present invention uses the transition detectors 38a and 38b to save calculation time for determining timing error, whereby the whole circuit can work at higher speed and at higher frequency.

Figure 5:
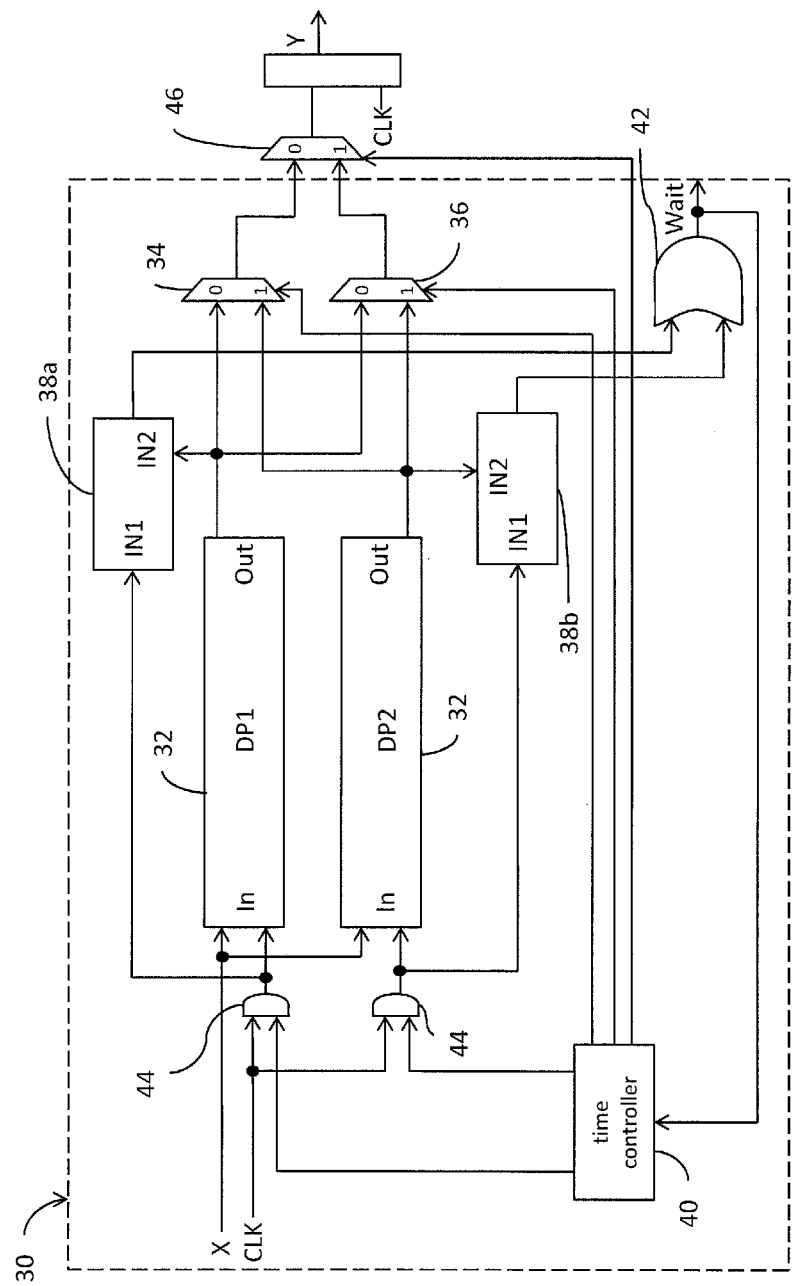
FIG. 5 is a diagram schematically showing operation of a device for detecting and correcting timing error according to one embodiment of the present invention.

After explaining the connection relationship and the processing method of the present invention, application of the present invention is described. Refer to FIG. 5. The device for detecting and correcting timing error 30 of the present invention is connected with a third multiplexer 46. The first multiplexer 34 and the second multiplexer 36 are connected with the third multiplexer 46, and the third multiplexer 46 is connected with the time controller 40. The first multiplexer 34 transmits the speculation value to the third multiplexer 46, and the second multiplexer 36 transmits the correct value to the third multiplexer 46. The third multiplexer 46 cooperates with the time controller 40 to optionally output the correct value or the speculation value as an output Y of data paths.

Figure 6:
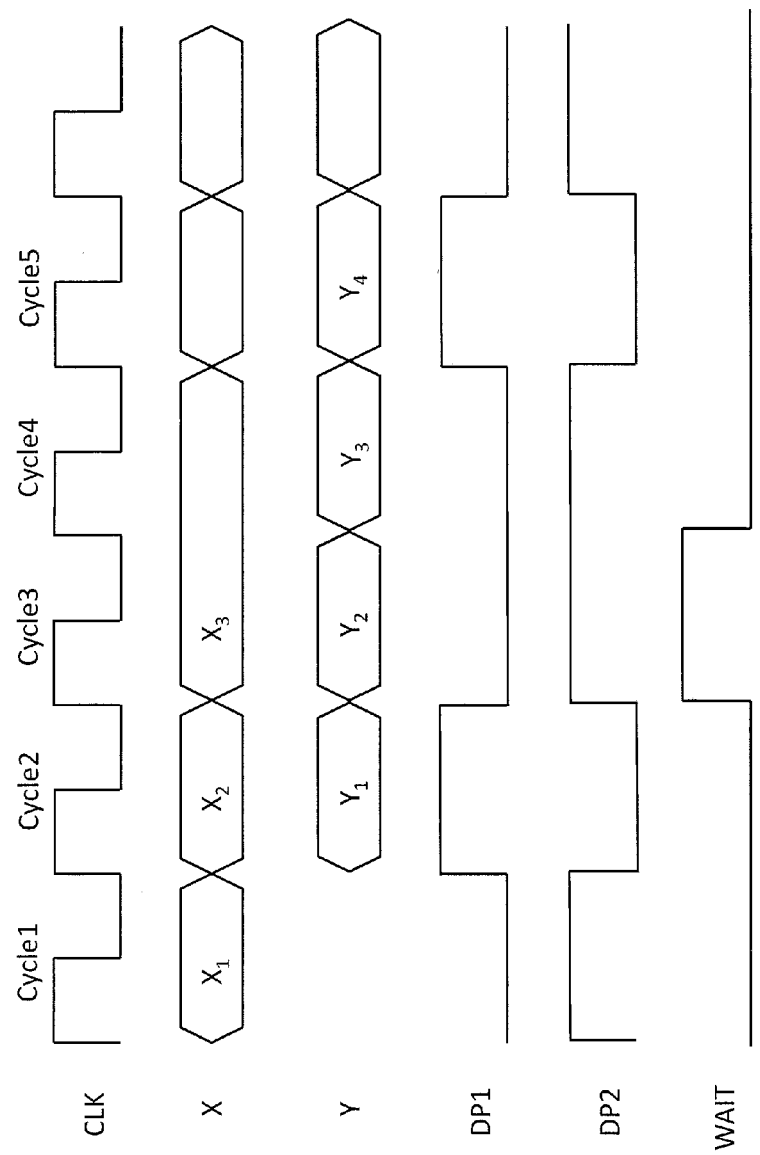
FIG. 6 is a timing diagram wherein a device for detecting and correcting timing error operates.

Then, the operation of the present invention is described according to the abovementioned embodiment and a timing diagram. Refer to FIG. 5 and FIG. 6. In calculation, the datapath unit DP1 32 and the datapath unit DP2 32 sequentially receive the input signal X in a round-robin way. When the datapath unit DP1 32 or the datapath unit DP2 32 receives "1" signal, the first input terminal IN1 of the transition detector 38a connected with the datapath unit DP1 32 or the first input terminal IN1 of the transition detector 38b connected with the datapath unit DP2 32 also receives "1" signal, which represents that the transition detector 38a or the transition detector 38b performs error detection on the datapath 32 which is calculating. The transition detector 38a or the transition detector 38b does not perform error detection on the datapath 32 if "0" signal is received by the datapath 32. The datapath unit DP1 32 processes the first input signal $X_1$ during the first cycle Cycle1, then obtains a speculation result $Y_1$ of the first speculation value during the second cycle Cycle2, and transmits data of the second input signal $X_2$ to the datapath unit DP2 32 for calculation, so as to obtain a speculation result $Y_2$ of the second speculation value during the third cycle Cycle3. Besides, the transition detector 38b is used to detect transition of the datapath unit DP2 32. When the value of the datapath unit DP2 32 is unstable, the speculation result $Y_2$ is wrong. The transition detector 38b uses the control logic gate 42 to output a wait signal Wait and uses the time controller 40 to receive the wait signal Wait. Data of the third input signal $X_3$ is inputted to datapath unit DP1 32 for calculation during the third cycle Cycle3. The time controller 40 delays the calculation for one cycle. A correct value $Y_3$ obtained by calculating the second input signal $X_2$ is outputted during the fourth cycle Cycle4. Since the datapath unit DP1 32 calculates the third input signal $X_3$ for two cycles. A correct value $Y_4$ obtained by calculating the third input signal $X_3$ is outputted during the fifth cycle Cycle5, and the correct value $Y_4$ is used as the correct value.

Compared with the conventional technology, the device for detecting and correcting timing error has shorter delay time and uses shorter cycles to improve efficiency. Alternatively, the present invention has less power dissipation under the same efficiency. For example, a test datapath unit is realized with a 16-bit multiplier. In a general case, the 16-bit multiplier reaches the fastest frequency of 1.67 GHz (0.6 ns). In the worst case, the 16 bit multiplier reaches the fastest frequency of 0.76 GHz (1.32 ns). As a result, in an advanced fabrication process, the time delay has doubled for an extreme variation case. The present invention can meet timing of normally performing functions in the worst environment and tolerate error at a typical-case frequency. In the conventional technology, Razor-1 has a problem with short path and a buffer is added, which results in great dissipation of power and area. Thus, Razor-1 has limited error toleration capability and works only at frequency of 0.88 GHz (1.14 ns). Besides, although a speculative lookahead (SL) device can solve the problem with short path, the speculative lookahead device reaches the fastest frequency of 1.11 GHz (0.9 ns). The speculative lookahead device uses a comparator to detect error and requires waiting for a correct value and comparison time. Unlike the speculative lookahead device, the present invention uses the transition detector that can immediately detect error to directly perform error detection on the speculation value, thereby reaching the fastest frequency of 1.52 GHz (0.66 ns). Accordingly, the present invention can perfectly perform in at near frequency of the 16-bit multiplier. Compared with the conventional technology, the present invention can improve 42% efficiency. Alternatively, the present invention can save 41% hardware resources and 54% power dissipation under the same efficiency.

Figure 7:
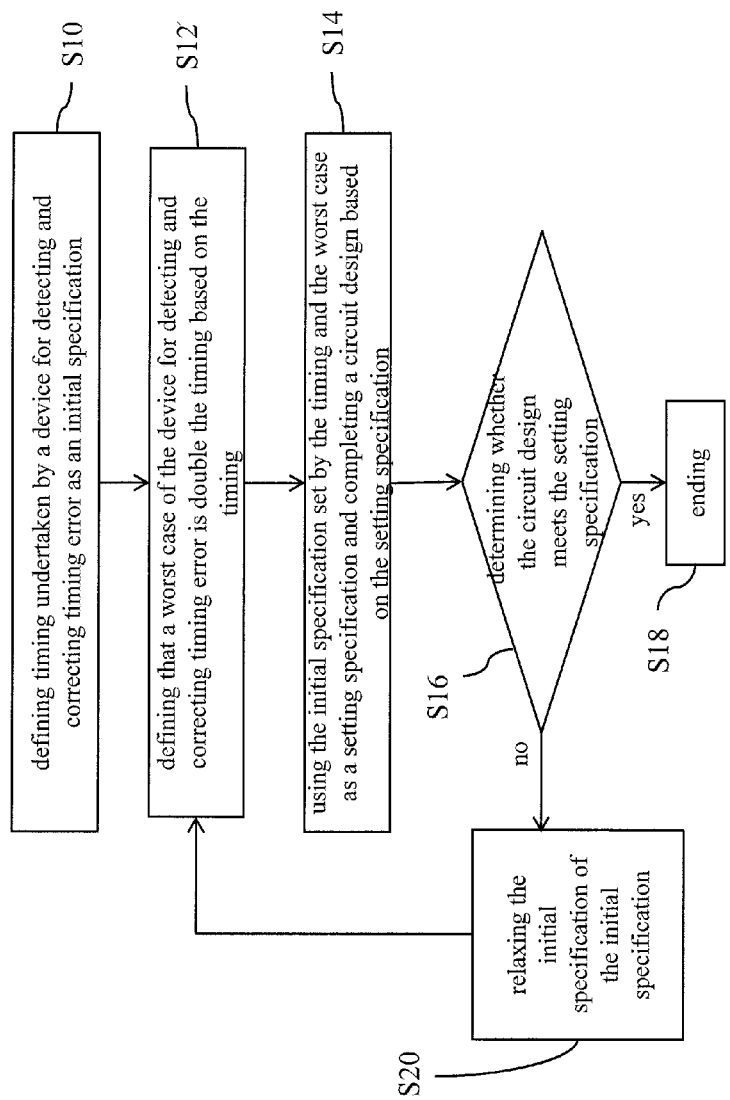
FIG. 7 is a flowchart diagram schematically showing a method for designing typical-case timing according to one embodiment of the present invention.

Continuing with the abovementioned paragraph, the present invention further discloses a method for designing typical-case timing. Refer to FIG. 7. The method for designing typical-case timing is applied to the device for detecting and correcting timing error 30 shown in FIG. 3. Firstly, in Step S10, timing undertaken by the device for detecting and correcting timing error 30 is defined as an initial specification. Then, in Step S12, the process defines that the worst case of the device for detecting and correcting timing error 30 is double the timing based on the timing in Step S10. In Step S14, the initial specification set by the timing and the worst case are used as a setting specification and a circuit design is completed based on the setting specification. Afterwards, in Step S16, the process determines whether the circuit design meets the setting specification originally set. If the answer is yes, the process proceeds to Step S18. In Step S18, the process finishes a typical-case design and ends. If the answer is no, the process proceeds to Step S20. In Step S20, the process relaxes the initial specification of the timing undertaken by the device for detecting and correcting timing error 30, and then proceeds to Step S12, whereby the worst case is reset based on the initial specification relaxed by the timing. Then, the process proceeds to subsequent steps until the circuit design meets the setting specification defined.

Then, the device for detecting and correcting timing error of the present invention is compared with two known different technologies, namely efficiency of an error detection circuit of Razor-1 and a speculative lookahead error detection circuit. The present invention shares a design process of the device for detecting and correcting timing error with the speculative lookahead error detection circuit. When Razor-1 operates in the method for designing typical-case timing, undertaken timing φ is defined as an initial specification in a typical-case environment, and timing δ is added for delaying circuits. In implementation, a shadow register of Razor-1 is triggered at a negative level of a clock. Thus, the initial timing δ is defined as 50% timing φ. If the buffer timing δ is added to cause timing violation in the process, the timing δ is adjusted again. If the timing δ is adjusted to 0, the specification refers to the typical-case frequency which Razor-1 cannot reach. In addition, the largest delay time that function units of Razor-1 tolerate in the worst case is φ+δ, which represents completion time is within φ+δ in the worst case. In such case, the shortest path is larger than the timing δ in any environment lest the data output have error, thereby completing a typical-case design of Razor-I meeting specifications.

Then, refer to Table 1 which shows comparison of dissipation of power and area of the method for designing typical-case timing of the present invention to known technologies. According to Table 1, a test datapath unit is realized with a 16-bit multiplier. In a typical case, the 16 bit multiplier reaches the fastest frequency of 1.67 GHz (0.6 ns). In the worst case, the 16-bit multiplier reaches the fastest frequency of 0.76 GHz (1.32 ns). As a result, in an advanced fabrication process, the time delay has at least doubled for an extreme variation case, so that the conventional design controls variations in the worst case to limit efficiency. The present invention has error toleration capability, meets timing of normally performing functions in the worst environment, and tolerates error at a typical-case frequency. At present, since a delay circuit is additionally added to Razor-1, Razor-1 has great dissipation of area and power. On top of that, Razor-1 has limited error toleration capability and only works only at frequency of 0.88 GHz (1.14 ns). Functions of Razor-1 are correctly undertaken, which is not guaranteed when Razor-1 works at higher frequency. The speculative lookahead device reaches the fastest frequency of 1.11 GHz (0.9 ns). The present invention is different from the two known technologies using comparators to detect timing error. The present invention needn't wait for the correct value and the comparison time. The present invention mainly uses the transition detectors that can immediately detect timing error to perform error detection on the speculation value. Consequently, the present invention reaches the fastest frequency of 1.52 GHz (0.66 ns). Compared with the known variable latency design Razor-1, the present invention can improve 42% efficiency. Alternatively, the present invention can save 41% hardware resources and 54% power dissipation under the same efficiency.

TABLE 1 comparison of dissipation of power and area of the method for designing typical-case timing of the present invention to known technologies.

| | | Area (μm²) | | | | |
|---|---|---|---|---|---|---|
| GHz | Delay (ns) | Typical case(TC) | Worst case(WC) | Razor-I | SL | The present invention |
| 1.67 | 0.60 | 1,428 | — | — | — | — |
| 1.52 | 0.66 | 1,047 | — | — | — | 3,704 |
| 1.39 | 0.72 | 841 | — | — | — | 2,932 |
| 1.28 | 0.78 | 769 | — | — | — | 2,438 |
| 1.19 | 0.84 | 713 | — | — | — | 2,158 |
| 1.11 | 0.90 | 683 | — | — | 3,413 | 2,018 |
| 1.04 | 0.96 | 677 | — | — | 2,699 | 1,907 |
| 0.98 | 1.02 | 666 | — | — | 2,307 | 1,838 |
| 0.93 | 1.08 | 664 | — | — | 2,119 | 1,859 |
| 0.88 | 1.14 | 661 | — | 3,040 | 2,036 | 1,793 |
| 0.83 | 1.20 | 662 | — | 2,394 | 1,853 | 1,783 |
| 0.79 | 1.26 | 661 | — | 2,173 | 1,723 | 1,766 |
| 0.76 | 1.32 | 652 | 1,855 | 2,157 | 1,610 | 1,766 |

| | | Energy (pJ) | | | | |
|---|---|---|---|---|---|---|
| GHz | Delay | Typical case(TC) | Worst case(WC) | Razor-I | SL | The present invention |
| 1.67 | 0.60 | 0.861 | — | — | — | — |
| 1.52 | 0.66 | 0.711 | — | — | — | 1.429 |
| 1.39 | 0.72 | 0.623 | — | — | — | 1.268 |
| 1.28 | 0.78 | 0.590 | — | — | — | 1.164 |
| 1.19 | 0.84 | 0.553 | — | — | — | 1.102 |
| 1.11 | 0.90 | 0.533 | — | — | 1.843 | 1.059 |
| 1.04 | 0.96 | 0.528 | — | — | 1.608 | 1.032 |
| 0.98 | 1.02 | 0.523 | — | — | 1.483 | 1.012 |
| 0.93 | 1.08 | 0.520 | — | — | 1.418 | 1.018 |
| 0.88 | 1.14 | 0.515 | — | 2.151 | 1.378 | 1.000 |
| 0.83 | 1.20 | 0.517 | — | 1.778 | 1.315 | 0.997 |

TABLE 1-continued comparison of dissipation of power and area of the method for designing typical-case timing of the present invention to known technologies.

| 0.79 | 1.26 | 0.515 | —     | 1.712 | 1.252 | 0.990 |
| 0.76 | 1.32 | 0.507 | 1.065 | 1.686 | 1.191 | 0.987 |

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A device for detecting and correcting timing error comprising:

two datapath units each having an input terminal and an output terminal, and each said datapath unit uses said input terminal thereof to receive an input signal, calculates said input signal and uses said output terminal thereof to generate and output a speculation value and a correct value;

a first multiplexer connected with said output terminal of each said datapath unit to receive and output said speculation value outputted by each said datapath unit;

a second multiplexer connected with said output terminal of each said datapath unit to receive and output said correct value outputted by each said datapath unit;

two transition detectors respectively connected with said output terminals of said datapath units, and when one of said datapath units outputs said speculation value, its corresponding said transition detector determines whether transition at said output terminal of said datapath unit corresponded thereof is stable, and when said transition is unstable, said transition detector outputs a wait signal, and when said transition is stable, said transition detector directly outputs said speculation value; and a control logic gate connected with said transition detectors to receive said wait signal outputted by one of said transition detectors, outputting it, and stalling said datapath unit outputting said speculation value for a period of time, whereby said second multiplexer outputs said correct value and said first multiplexer corrects said speculation value and then outputs it.

2. The device for detecting and correcting timing error according to claim 1, wherein said output terminals of said datapath units further receive a clock signal being 0 or 1, and said speculation value and said correct value are 0 or 1.

3. The device for detecting and correcting timing error according to claim 2, wherein each said transition detector further comprises:

two registers each having a data input terminal and a clock signal terminal, and said data input terminals of said registers are connected with said input terminal of said datapath unit to receive said clock signal, and said clock signal terminals of said registers are connected with said output terminal of said datapath unit to receive said speculation value; and an OR gate connected with said registers, and when said clock signal received by one of said registers is 1 and said speculation value received by said register changes from 1 into 0 or changes from 0 into 1, said register outputs said clock signal and uses said OR gate to output said wait signal.

4. The device for detecting and correcting timing error according to claim 2, further comprising a time controller connected with said transition detectors, said control logic gate, said first multiplexer and said second multiplexer, transmitting an output thereof and said clock signal to said datapath units, and controlling timing of using said first multiplexer and said second multiplexer to respectively receive said correct value and said speculation value.

5. The device for detecting and correcting timing error according to claim 4, further comprising two demultiplexers connected between said time controller and said datapath units, and an input terminal of said demultiplexer connects with said time controller and receives said clock signal, and an output terminal of said demultiplexer transmits said clock signal to said datapath units.

6. The device for detecting and correcting timing error according to claim 1, wherein said control logic gate is an OR gate.

7. The device for detecting and correcting timing error according to claim 4, wherein said time controller controls time of outputting said correct value and outputs said correct value through said second multiplexer.

8. The device for detecting and correcting timing error according to claim 1, wherein said period of time that said datapath unit stalls is one cycle.

9. The device for detecting and correcting timing error according to claim 4, further comprising a third multiplexer connected said first multiplexer, said second multiplexer and said time controller, receiving said correct value from said second multiplexer, receiving said speculation value from said first multiplexer, and cooperating with said time controller to optionally output said correct value or said speculation value.

10. A method for designing typical-case timing applied to said device for detecting and correcting timing error of claim 1, and said method comprising:

Step (a): defining timing undertaken by said device for detecting and correcting timing error as an initial specification;

Step (b): defining that a worst case of said device for detecting and correcting timing error is double said timing based on said timing; and Step (c): using said initial specification set by said timing and said worst case as a setting specification and completing a circuit design based on said setting specification.

11. The method for designing typical-case timing according to claim 10, further comprising a step of determining whether said circuit design meets said setting specification:

if yes, ending; and if no, relaxing said initial specification and returning said Step (b) to proceed to subsequent steps.

* * * * *